(12) United States Patent
Miyata (10) Patent No.: US 9,370,093 B2
(45) Date of Patent: Jun. 14, 2016

(54) WIRING BOARD AND LIGHT EMITTING DEVICE USING SAME

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 115 days.

(21) Appl. No.: 14/271,557

(22) Filed: May 7, 2014

(65) Prior Publication Data

US 2014/0334164 A1    Nov. 13, 2014

(30) Foreign Application Priority Data

May 10, 2013   (JP) .................. 2013-100696

(51) Int. Cl.
| | |
|---|---|
| *H05K 1/00* | (2006.01) |
| *H05K 1/02* | (2006.01) |
| *F21Y 101/02* | (2006.01) |
| *F21Y 103/00* | (2016.01) |

(52) U.S. Cl.
CPC ........... *H05K 1/0256* (2013.01); *F21Y 2101/02* (2013.01); *F21Y 2103/003* (2013.01); *H05K 1/028* (2013.01); *H05K 2201/055* (2013.01); *H05K 2201/09727* (2013.01); *H05K 2201/10106* (2013.01)

(58) Field of Classification Search
None
See application file for complete search history.

(56) References Cited

U.S. PATENT DOCUMENTS

| | | | | |
|---|---|---|---|---|
| 5,461,202 A * | 10/1995 | Sera | ................... | H05K 1/189 174/254 |
| 6,108,211 A * | 8/2000 | Diessner | .............. | H01R 13/701 200/512 |
| 2007/0139961 A1 * | 6/2007 | Cheah | ................... | G02B 6/0065 362/612 |
| 2008/0296049 A1 * | 12/2008 | Honjo | ................... | H05K 1/0218 174/254 |
| 2009/0109636 A1 * | 4/2009 | Arnold | ................ | H01L 23/4985 361/728 |
| 2009/0120670 A1 * | 5/2009 | Lo | .......................... | H05K 1/028 174/254 |
| 2009/0251634 A1 * | 10/2009 | Lu | .......................... | H05K 1/189 349/58 |
| 2009/0273925 A1 * | 11/2009 | Schultz | ................ | H05K 1/0203 362/249.01 |
| 2010/0243297 A1 * | 9/2010 | Oosawa | ................. | G11B 5/486 174/251 |
| 2012/0182753 A1 * | 7/2012 | Otsubo | ..................... | F21K 9/13 362/544 |
| 2012/0287614 A1 | 11/2012 | Kajiya et al. | | |
| 2013/0107526 A1 | 5/2013 | Ishibashi et al. | | |

FOREIGN PATENT DOCUMENTS

| | | |
|---|---|---|
| JP | 06-006003 A | 1/1994 |
| JP | 2012-226934 A | 11/2012 |
| JP | 2013-084803 A | 5/2013 |
| JP | 2013-118169 A | 6/2013 |

* cited by examiner

*Primary Examiner* — Steven T Sawyer
(74) *Attorney, Agent, or Firm* — Global IP Counselors, LLP (57) ABSTRACT

A wiring board includes an insulated substrate, a wiring pattern and a folded part. The insulated substrate has an elongated shape with shorter sides extending along a width direction. The wiring pattern is provided on the substrate. The wiring pattern extends between both ends in the width direction of the substrate, and has an exposed part exposed at at least one of the ends of the substrate. In the folded part, the exposed part of the wiring pattern and the substrate are integrally folded up inwardly toward an upper face side of the substrate at each of the ends of the substrate.

14 Claims, 10 Drawing Sheets

WIRING BOARD AND LIGHT EMITTING DEVICE USING SAME

CROSS-REFERENCE TO RELATED APPLICATIONS

This application claims priority to Japanese Patent Application No. 2013-100696 filed on May 10, 2013. The entire disclosure of Japanese Patent Application No. 2013-100696 is hereby incorporated herein by reference.

BACKGROUND

The present disclosure relates to a wiring board comprising, for example, a flexible insulated substrate and a wiring pattern provided on the substrate, as well as to a light emitting device in which this wiring board is used.

DESCRIPTION OF THE RELATED ART

In order to perform plating on a wiring pattern of a flexible wiring board for light emitting device, the flexible wiring board has a connecting pad for connecting an electroplating electrode, and is connected to a wiring pattern.

The flexible wiring board is usually made by forming a single continuously formed wiring pattern, and then being cut at a specific location, so a wiring conductor is exposed at the cut part (see JP H6-6003A, for example).

When the edge of the wiring pattern is exposed in the same plane as the end of the insulated board in the conventional flexible wiring board, the distance from the rear face side of the insulated board to the wiring pattern (called the creepage distance) may be extremely short.

Accordingly, with the flexible wiring board, if the light emitting element is mounted on the wiring pattern and housed in a housing, for example, there may be the problem that the drive power applied to the wiring pattern will flow through the edge of the wiring pattern to the metal housing and shock the user.

There may be also problems such as the fact that noise such as static electricity from the outside can passes to the metal housing through the edge of the wiring pattern, which creates uneven brightness in the light emitting element and makes it difficult to emit light in a stable state.

Accordingly, an object of the present invention is to provide a wiring board in which insulating property is ensured by securing adequate creepage distance, and to provide a light emitting device in which this wiring board is used.

SUMMARY

The present disclosure relates to a wiring board. The wiring board comprises; an insulated substrate having an elongated shape with shorter sides extending along a width direction, a wiring pattern provided on the substrate, and a folded part. The wiring pattern extends between each of ends of the substrate, and having an exposed part exposed at at least one of the ends of the substrate. The folded part is folded inwardly toward an upper face side at both of the ends integrally with the exposed part of the wiring pattern.

The present invention also relates to a light emitting device. The light emitting device includes the wiring board described above, and a light emitting element disposed on the wiring board According to the present invention, adequate creepage distance is secured in the wiring board, which prevents the leakage of drive power and the infiltration of noise. Also, a light emitting device in which this wiring board is used can emit light uniformly without unevenness in the brightness of the light emitting element.

DETAILED DESCRIPTION

The wiring board pertaining to an embodiment of the present invention, and the light emitting device having the wiring board, will now be described through reference to FIGS. 1 to 7.

In the following embodiment and examples, the wiring board 1 and light emitting device S that embody the technological concept of the present invention are merely examples, the dimensions, materials, shapes, relative layout, and so forth of the constituent parts discussed in the embodiment are not intended to limit the scope of the present invention, and are merely examples given for the sake of illustration. The sizes and the arrangement relationships of the members in each of drawings are occasionally shown exaggerated for ease of explanation. Also, in the description of the embodiments, the various members of the wiring board 1 are formed in approximate symmetry around the center in the width direction (short side direction), so the description will mainly focus on one side, and description of the other side will be omitted as needed.

Figure 1:
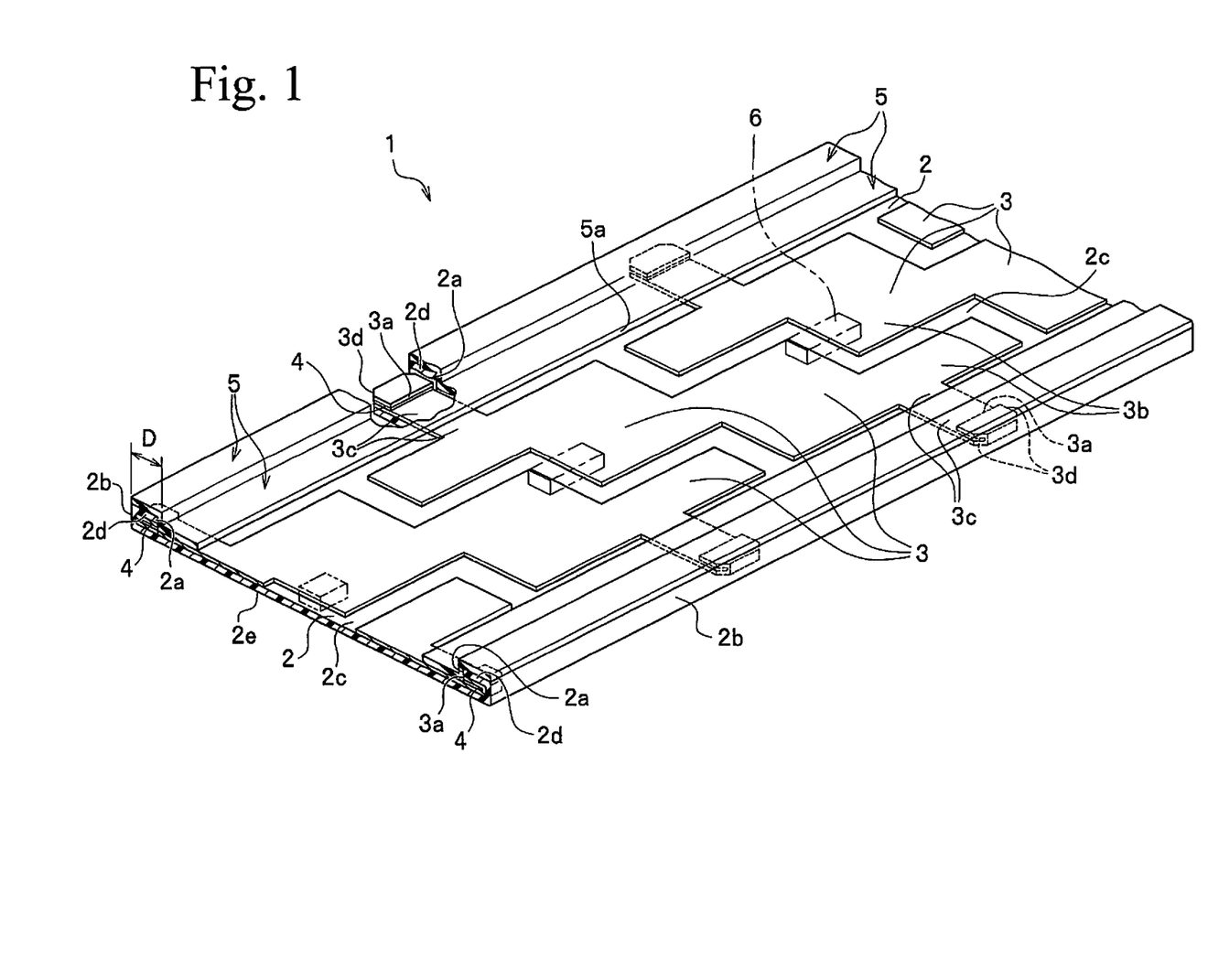
FIG. 1 is an enlarged and simplified partial oblique view of the main components of the wiring board pertaining to an embodiment of the present invention.

As shown in FIG. 1, the wiring board 1 has a wiring pattern 3 on an upper face of an insulated substrate 2, and is a flexible circuit board on which electronic elements and so forth are mounted, and allows at least one light emitting element 6 to be mounted. The wiring board according to an embodiment of the invention will be described below.

The wiring board 1 on which the light emitting elements 6 are mounted is described as an example of the embodiment, and the wiring board 1 is used for the light emitting device S.

The light emitting elements 6 are a light source for the light emitting device S such as a light emitting diode or a laser diode. The composition, emission color, size, number, and so forth of the light emitting element 6 can be suitably selected according to the intended use.

Configuration of Light Emitting Device

Figure 2A:
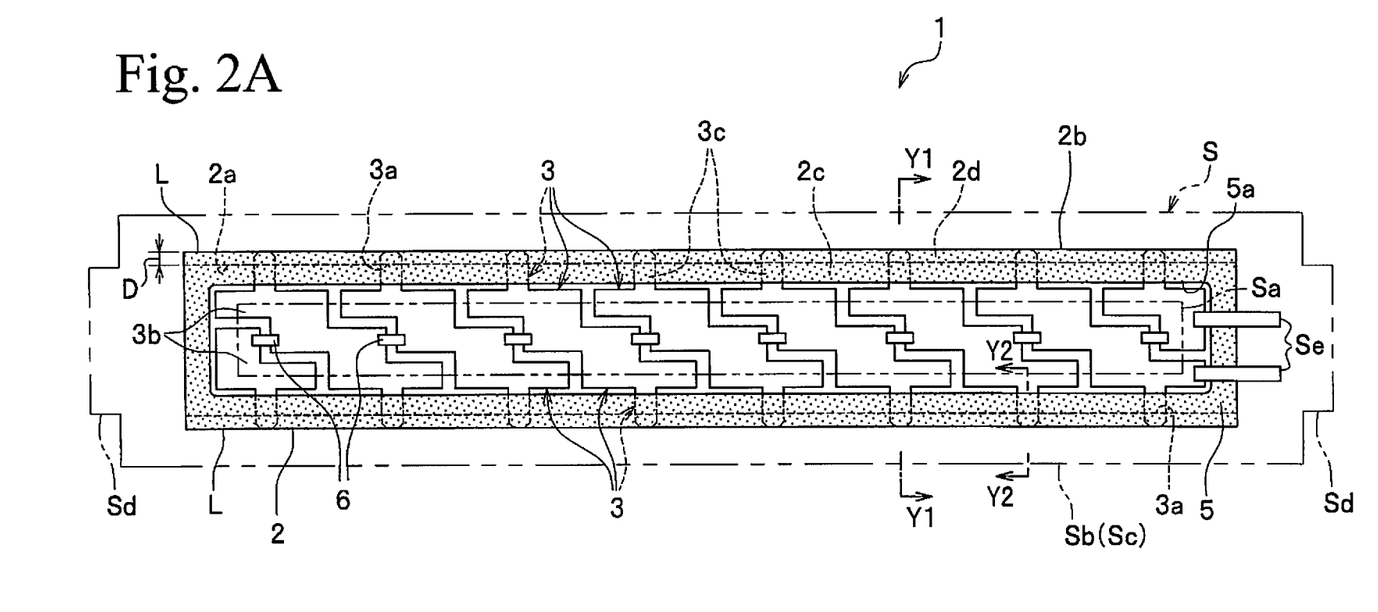
FIGS. 2A and 2B show a wiring board in a state in which a resist has been provided, and a light emitting device in which the wiring board is used, with 2A being a simplified plan view and 2B being an enlarged cross section in the Y2-Y2 arrow direction.
Figure 2B:
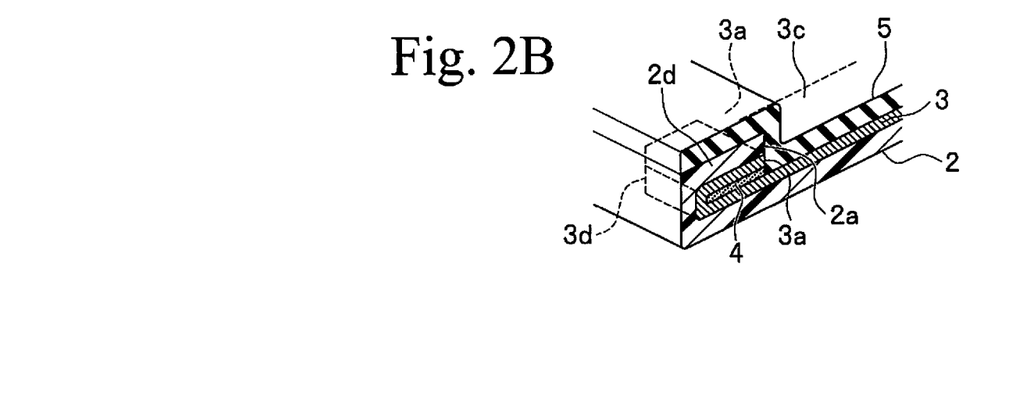

As shown in FIGS. 2A and 2B, the light emitting device S emits light from the light emitting element 6 of a light emitting part Sa when electrical power is supplied. This light emitting device S can be used, for example, as a light source for a lighting fixture. The light emitting device S has the wiring board 1, the light emitting element 6 disposed on the wiring board 1, and a resist 5 (reflective member) formed over the substrate 2 and the wiring patterns 3. The light emitting device S is installed in a housing Sc that supports the wiring board 1 (see FIGS. 5 and 6).

Figure 5:
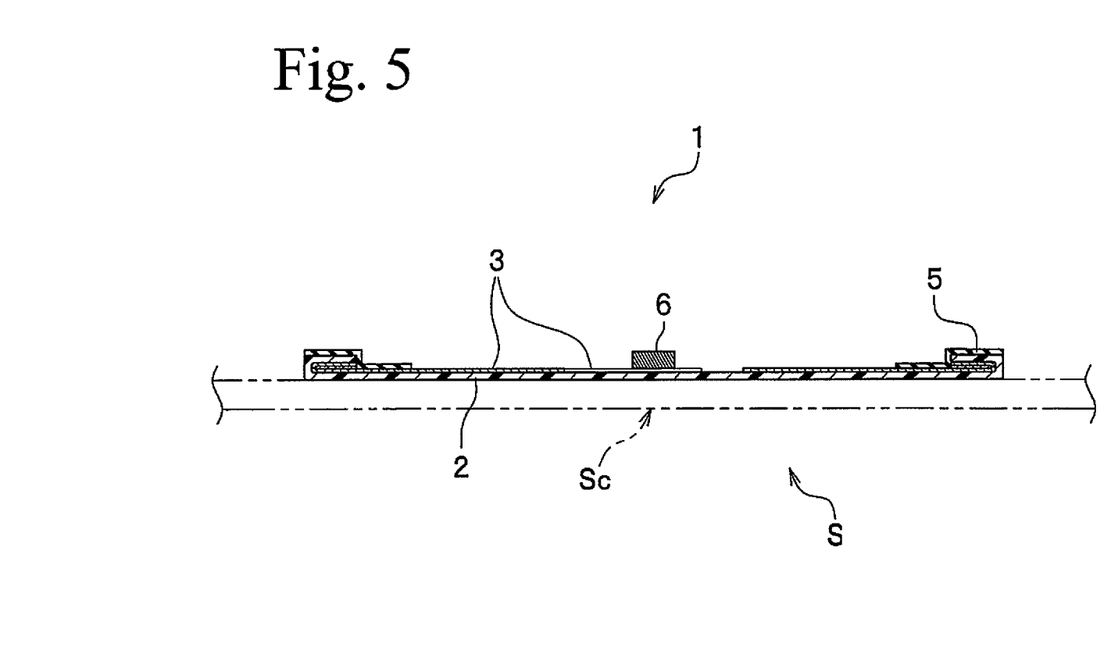
FIG. 5 is an enlarged cross section in the Y1-Y1 arrow direction in FIG. 2.

As shown in FIG. 5, the wiring board 1 of the light emitting device S has a narrow and long rectangular shape having a lengthwise direction and a short side (width) direction, and as shown in FIG. 2A, a plurality of the light emitting elements 6 are arranged along the lengthwise direction of the wiring board 1.

Therefore, the light emitting part Sa, which is the light emitting region of the light emitting device S, is a region extending along the lengthwise direction of the wiring board 1.

Configuration of Wiring Board

As shown in FIG. 1, the wiring board 1 is a circuit board that is used to mount a plurality of the light emitting elements 6 on the upper face 2c and to electrically connect the light emitting elements 6 to the wiring board. The wiring board 1 has the wiring pattern 3 formed on the substrate 2, and the resist 5 is provided so as to expose mounting parts 3b of the wiring pattern 3. Also, the wiring board 1 is bonded by double-sided tape, for example, at a predetermined location on the housing Sc (see FIG. 5).

Configuration of Substrate

The substrate 2 is formed from an insulated member in the form of a slender, thin plate that is flexible and constitutes the main substrate (base film) of the wiring board 1. A polyimide, polyethylene terephthalate, or other such material can be used for the substrate 2. The substrate 2 is formed as a thin film, and its thickness can be set as long as flexibility is not sacrificed, for example, between 10 and 100 μm. The substrate 2 comprises folded parts 2d that are folded and formed thicker than the center region of the substrate 2 at both ends in the width direction.

Figure 7A:
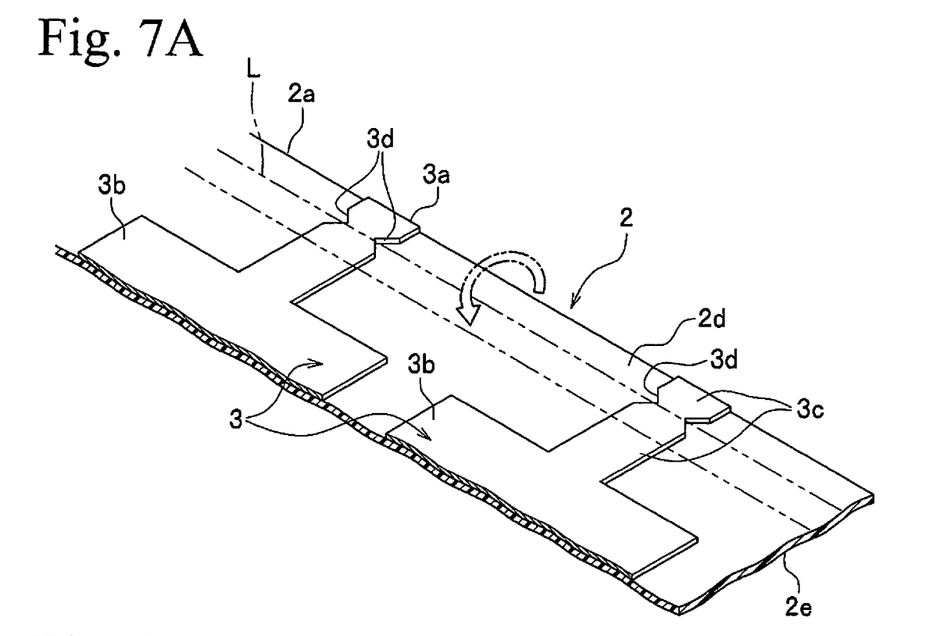
FIG. 7A is an enlarged and simplified partial oblique view of the main components of the wiring board before a folded part is formed.
Figure 7B:
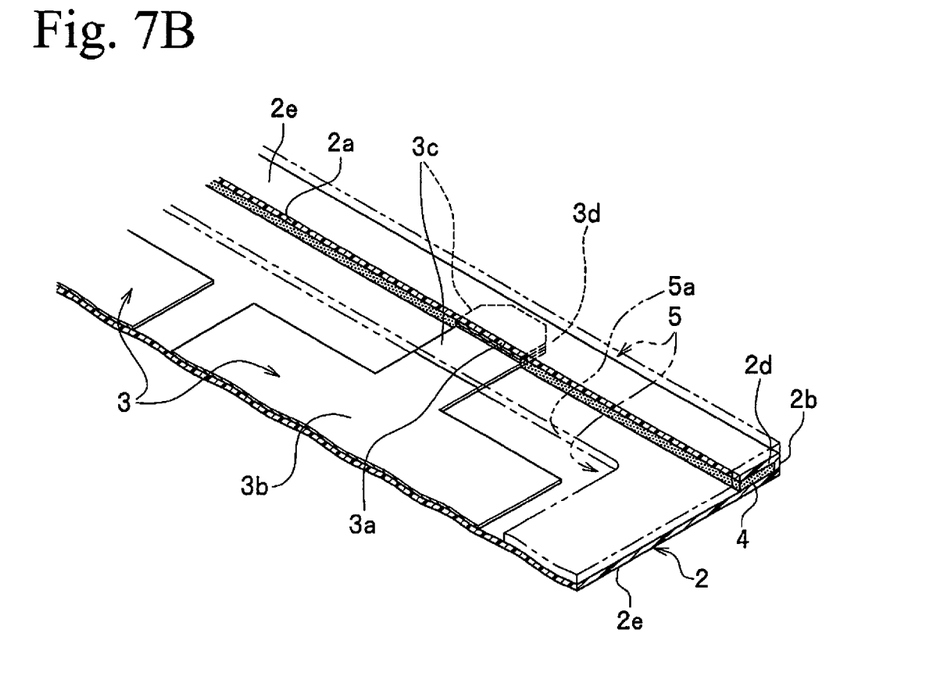
FIG. 7B is an enlarged and simplified oblique view of the wiring board after the folded part has been formed.

As shown in FIGS. 2A and 2B, the folded parts 2d are formed by folding the two ends in the width direction of the substrate 2, which used to be a flat sheet, inwardly along predetermined bending lines L. These folded parts 2d are formed in order to secure the creepage distance D of the wiring board 1 and reduce the leakage of drive power and the infiltration of noise. Specifically, as shown in FIG. 7A, with the wiring board 1 without the folded parts 2d, the wiring pattern 3 is formed by plating over the substrate 2, which is entirely in the form of a flat sheet, and the wiring pattern 3 is exposed at both ends of the substrate 2 in the width direction. With such a configuration, the leakage of drive power and the infiltration of noise from the outside tend to occur. Therefore, as shown in FIG. 7B, the folded parts 2d are formed by folding part of the wiring pattern 3 and both ends of the substrate 2 in the width direction inward, so that exposed parts 3a which are cut surface of the wiring pattern 3 at the edge of the substrate 2, will not be exposed.

The method for forming the folded parts 2d will now be briefly described.

Figure 3A:
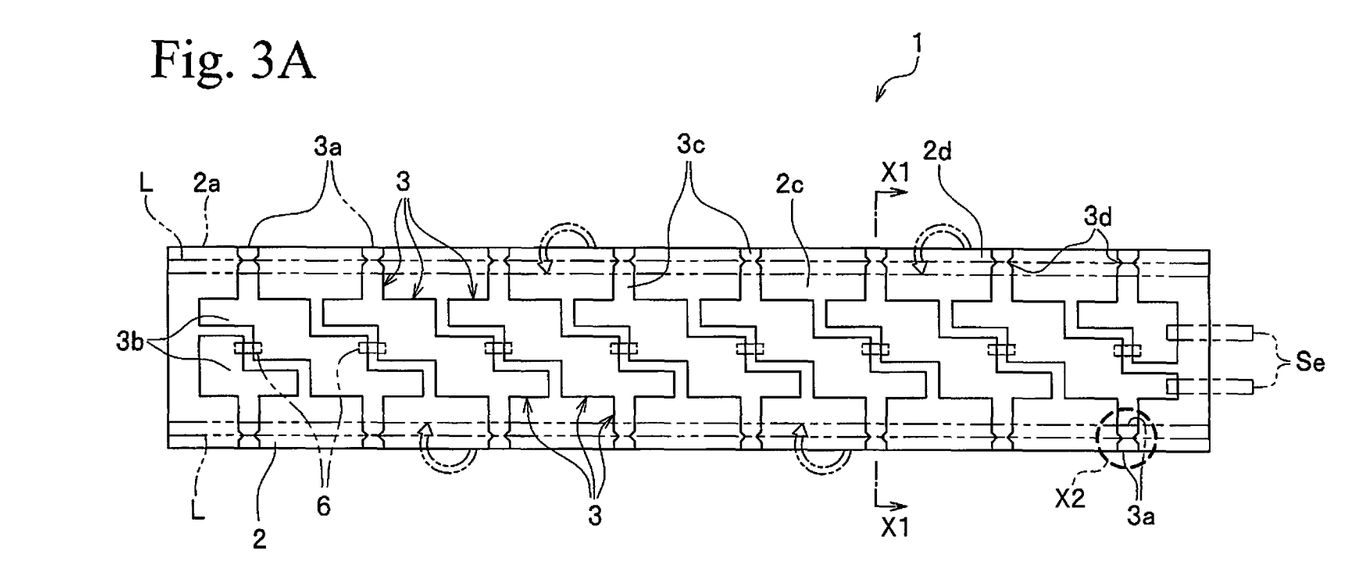
FIGS. 3A and 3B show the wiring board, with 3A being a simplified plan view and 3B being an enlarged oblique view of the X2 part.

First, a sheet that will serve as the substrate 2 is provided, and the wiring pattern 3 are formed by plating on the upper face 2c of the substrate 2. The material of the substrate 2 is then punched out with a press, a slitter, a cutter, or the like to form a rectangular shape having shorter sides extending along the width direction, as shown in FIG. 3A. The exposed parts 3a of the wiring pattern 3 are formed at the edges 2a at both ends in the width direction of the substrate 2 cut by the punching or the like.

Figure 3B:
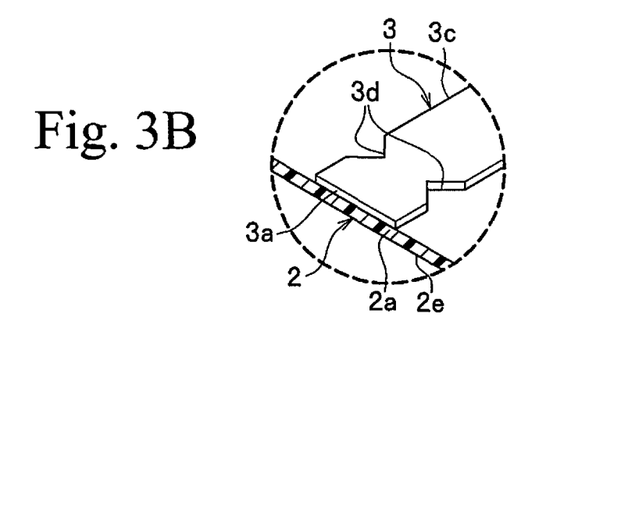
Figure 4:
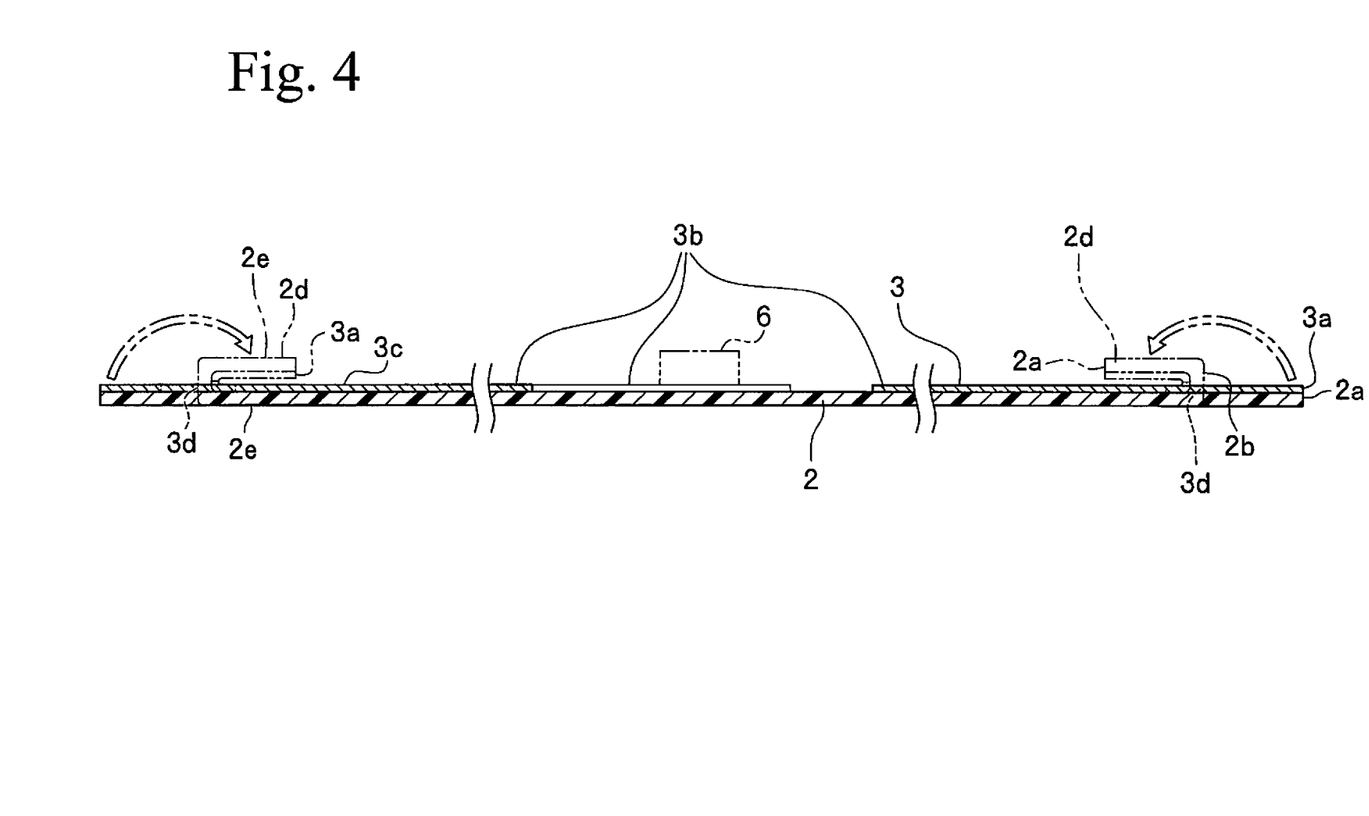
FIG. 4 is an enlarged cross section in the X1-X1 arrow direction in FIG. 3.

Next, as shown in FIGS. 3A and 3B, the ends of the substrate 2 in the width direction are bent along predetermined bending lines L at the portion on which the exposed parts 3a of the wiring pattern 3 are provided by a press or the like.

Thus, as shown in FIGS. 2A and 2B, at both ends in the width direction of the substrate 2, the folded parts 2d at which the substrate 2 and the wiring pattern 3 are folded inward to the upper face side of the wiring board 1 are formed. The inner face (lower face) sides of the folded parts 2d are bonded on the upper face 2c of the substrate 2 with an adhesive agent 4 to hold the folded parts 2d in their folded state. The folded parts 2d thus provided are formed in the shape of a band at both ends in the width direction of the substrate 2 along the lengthwise direction.

Bent parts 2b and the folded parts 2d formed on the substrate 2 will be described in further detail through reference to FIGS. 7A and 7B.

At the folded parts 2d, the substrate 2 and the wiring pattern 3 are folded so as to superpose the surface of the wiring board 1 (the upper face 2c of the substrate 2, for example), which allows the position of the exposed parts 3a to be moved from the ends in the width direction of the substrate 2 to a position closer to the center of the substrate 2, and thus the proper creepage distance D is secured.

The length of the creepage distance D is standardized in Japan Industrial Standard "JIS C 6950." The length of the creepage distance D will vary with the voltage and material, but can be about 1 to 2 mm.

Because the wiring board 1 includes the folded parts 2d, as shown in FIG. 2B, the structure is such that the edges in the width direction of the wiring board 1 have the thickness of several layers. Thus, this structure increases strength and bending stiffness at these edges.

In the example shown in FIG. 2B, the edges in the width direction of the wiring board 1 are made up of a total of five layers, starting from the top: a layer of the folded part 2d, a layer of extensions 3c of the wiring pattern 3 that is folded, a layer of the adhesive agent 4, a layer of the extensions 3c of the wiring pattern 3 that is not folded, and a layer of the substrate 2 that is not folded.

The adhesive agent 4 can be any type that allows the folded parts 2d to be bonded on the upper face 2c of the wiring board 1, and there are no particular restrictions on the material thereof. The adhesive agent 4 is preferably an insulating material, and more preferably a resin that is not prone to electrical problems. The adhesive agent 4 is preferably a white material with high reflectivity. In this case the upper faces of the folded parts 2d are also preferably coated. This improves the reflectivity of the folded parts 2d that appear on the emission side of the light emitting device S, and increases the light-extraction efficiency of the light emitting device S.

Configuration of Wiring Pattern

As shown in FIGS. 2A and 2B, the wiring pattern 3 is conductive foil (conductor pattern) provided on the substrate 2, and the numerous light emitting elements 6 are mounted on or electrically connected to the wiring pattern 3. The wiring pattern 3 is arranged such that a plurality of sets of the mounting parts 3b (described below) are disposed in a row with a suitable spacing in the lengthwise direction on the upper face 2c, for example.

The wiring pattern 3 comprises the plurality of mounting parts 3b disposed in the center of the substrate 2, and extensions 3c (extension portions) disposed from each of the mounting parts 3b to the exposed parts 3a.

With the light emitting device S, the shape and thickness of the wiring pattern 3 can be suitably changed depending on number, type, size, and so forth of the light emitting elements 6.

There are no particular restrictions on the material of the wiring pattern 3, as long as it is electrically conductive, but it is preferable that the material has high thermal conductivity. Examples of such materials include gold, silver, copper, aluminum, alloys of these, and other such conductive materials.

Also, the method for forming the wiring pattern 3 is not limited to etching after bonding, and may instead be plating, coating with a conductive paste, printing, or the like.

The wiring pattern 3 is preferably provided so that breakage will not easily occur during bending. For example, a thin-film of gold or another such metal can be used preferably. This is because if the wiring breaks during folding, the flexible substrate itself will also break at the same time, which can end up exposing the wiring pattern 3, so that the sufficient creepage distance D is not secured.

The wiring pattern 3 can be thick enough not to lose the flexibility of the wiring board 1, and can be thin enough to bend to form the folded parts 2d. About 10 to 200 μm is preferable, for example.

The wiring pattern 3 is preferably formed so as to cover substantially the entire surface of the substrate 2. This increases the heat dissipation of the light emitting device S.

As shown in FIGS. 3A and 3B, the exposed parts 3a of the wiring pattern 3 are the cut surfaces of the cut wiring pattern 3, which is used as electrodes for electroplating the wiring pattern 3 before cutting.

As shown in FIGS. 2A and 2B, the mounting parts 3b of the wiring pattern 3 are element installation faces where each the light emitting elements 6 are mounted, and are exposed portions of the wiring pattern 3 formed continuously with the extensions 3c and arranged so as to be exposed from the resist 5. The mounting parts 3b are a plurality of pairs (sets) of substantially L-shaped conduction parts provided between the extensions 3c at both edges in the width direction of the substrate 2, with a groove in between.

The light emitting elements 6 are flip-chip mounted on a pair of the mounting parts 3b so as to straddle the groove formed between the pair of the mounting parts 3b. In this embodiment, each set of mounting parts 3b is arranged such that the conductive foils, which are formed in a symmetrical shape and in the same surface area, are arranged symmetrically. A number of (such as eight sets) the mounting parts 3b are disposed in a row in the lengthwise direction of the substrate 2.

Some mounting parts 3b of the wiring pattern 3 are provided with leads Se that are connected to terminals or the like inside connectors Sd formed at both ends in the lengthwise direction of the housing Sc (see FIG. 2A). Thus, the mounting parts 3b also function as lead connectors on which the leads Se are installed.

The extensions 3c are wiring portions that extend in a band from the mounting parts 3b to the exposed parts 3a at both ends in the width direction of the substrate 2. Each extensions 3c has an exposed part 3a disposed in the same perpendicular plane as the end 2a of the substrate 2, and a narrow width part 3d formed on the bending line L where folding is done.

The narrow width parts 3d are formed in a V shape at both edges in of the extensions 3c. The purpose in forming the narrow width parts 3d is to make it easier for the extensions 3c to bend along the bending lines L by reducing the width of the extensions 3c. These narrow width parts 3d and the extensions 3c are formed at the same time with in the formation of the wiring pattern 3 by plating, etc. A region where the thickness is less than in other parts may be provided to the extensions 3c. This makes it easier for the extensions 3c to bend along the bending lines L.

Configuration of Resist

Figure 6:
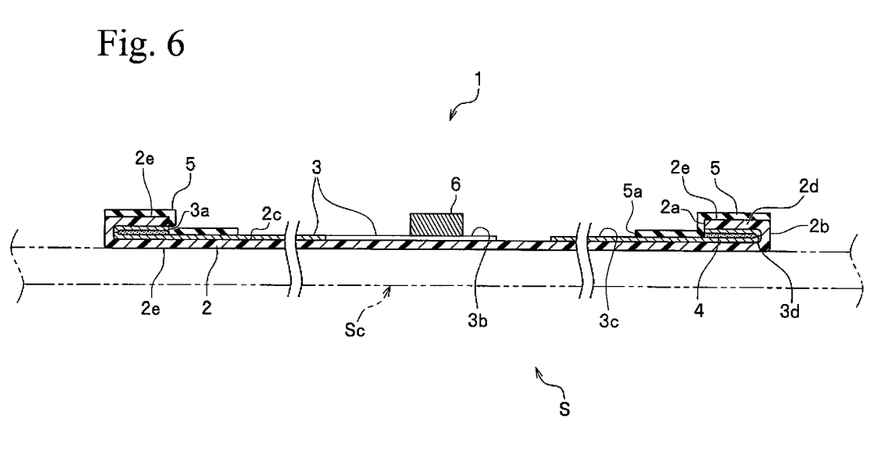
FIG. 6 is an enlarged view of the main components in FIG. 5.

As shown in FIG. 6, the resist 5 is provided over the wiring pattern 3 to ensure electrical insulation. This protects the wiring pattern 3 and the substrate 2 from external force, moisture, and so forth. The resist 5 has an opening 5a corresponding to the mounting parts 3b, and the mounting parts 3b are inside the opening 5a. As shown in FIGS. 2A and 2B, the resist 5 coats substantially the entire surface of the wiring board 1, on which the folded parts 2d are folded over, except for the mounting parts 3b. The resist 5 may also be the same member as the adhesive agent 4.

The resist 5 may be of the same material as the resist formed over the wiring pattern 3, or it may be of a different material.

The resist 5 is also used as a reflecting member. For instance, it can be a member of the same color as the light emitted from the light emitting elements 6 (for example, a blue resist 5 when the light emitting elements 6 emit blue light), a material having a reflection region corresponding to the emission wavelength of the light emitting elements 6 or the wavelength conversion member, a white material, or the like.

This improves the light output of the light emitting device S. Examples of such material include materials in which silicon oxide or titanium oxide has been mixed into an epoxy resin, a urea resins, a silicone resins, a modified epoxy resin, a modified silicone resin, a polyamide, or the like. A material obtained by mixing titanium oxide, silicon oxide, or another such material that reflects light into a resin with high light resistance, such as a silicone resin, is particularly favorable.

The resist 5 shown in FIG. 6 is applied so as to cover the upper face 2c of the folded parts 2d and the exposed parts 3a of the wiring pattern 3, but this is not limited thereto, and the resist 5 may be provided before the folded parts 2d are formed. This allows the reflecting member to be formed easily by printing or the like. In this case, the exposed parts 3a are preferably covered by a different reflecting member or resist. If a reflecting member is provided before the folded parts 2d are formed, the reflecting member preferably has insulating properties and covers the extensions 3c. This prevents damage to the extensions 3c during folding, and prevents electrical malfunctions.

Configuration of Light Emitting Elements

The light emitting elements 6 are disposed in the light emitting device S, and are fixed by die bonding members or the like on the sets of the mounting parts 3b arranged in a row in the lengthwise direction on the upper face 2c of the substrate 2.

The light emitting elements 6 are semiconductor light emitting elements, and an LED chip composed of a gallium nitride-based compound semiconductor can be used, for example. A plurality of the light emitting elements 6 are aligned in a row with a suitable spacing, and are disposed so that they can illuminate a wide area. There are no particular restrictions on the brightness, emission color, shape, number, type, and so forth of the light emitting elements 6, so long as they are elements that emit light, and they can be suitably selected according to the intended use, etc.

The electrical connection between the positive and negative electrodes formed on the substrate 2 and the light emitting elements 6 may be accomplished by a flip-chip mounting method so that the p-side electrodes and the n-side electrodes of the light emitting elements 6 face to the electrodes on the substrate 2, or may be accomplished by using wire bonding method.

In the case where a package having substantially the same size as the light emitting elements 6, which is known as a CSP (chip scale package), high-density mounting using a flip-chip connection method (face-down bonding method) is available.

A sealing member is formed so as not to expose at least the light emitting elements 6 and the wiring pattern 3 (for example, so that the ends will cover the reflecting member), and the shape of this sealing member is, for example, formed in a hemispherical shape as seen in a vertical cross section. The sealing member may contain a wavelength conversion member (phosphor) or a light scattering material. The wavelength conversion member and light scattering material may be provided inside the sealing member, etc., or may be provided to a cover member Sb (discussed below), etc.

Configuration of Housing

As shown in FIG. 5, the housing Sc is a member that is affixed by adhesion, etc., on the rear face 2e side of the wiring board 1, and supports the lateral side or the rear face 2e side of the wiring board 1. For example, in the case where it is formed by a metal member with good heat dissipation properties, it can also function as a heat sink. The housing Sc has connectors Sd which are provided at both ends in the lengthwise direction of the housing Sc for connecting the wiring pattern 3 of the light emitting device S to an external power source, and the cover member Sb disposed at the upper part.

As shown in FIG. 2A, the cover member Sb is a transparent or semitransparent resin or glass member that is rectangular in plan view and covers the light emitting part Sa, for example.

A scattering plate that scatters and reflects light, a phosphor layer or the like may be installed above the light emitting elements 6 and inside the cover member Sb of the light emitting device S. The cover member Sb and the housing Sc may be formed integrally, or may be suitably modified corresponding to the shape of the light emitting device S, the wiring board 1, etc.

Method for Manufacturing Wiring Board and Light Emitting Device in which the Wiring Board is Used As shown in FIG. 3A, when the wiring board 1 is formed, first a wiring material is affixed with an adhesive member to one face of the substrate 2, after which it is formed in the shape of the wiring pattern 3 by etching, etc. In this case, copper wiring pattern 3 having eight pairs of pattern is formed in a line in the lengthwise direction of the substrate 2 on the upper face 2c of the substrate 2, for example. After this, the wiring pattern 3 is electroplated with gold. The peripheral portions of the substrate 2 are cut with a press to form a rectangular substrate 2 such as shown in FIG. 3A.

The wiring material can be conductive, and a metal is preferable.

Copper, aluminum, and the like are particularly favorable because they are very malleable and can be made thin enough to be flexible. Furthermore, aluminum is preferable because of its high optical reflectivity. Nickel, gold, tin, and copper are favorable as the plating material, of which gold and tin are especially good because of their good affinity with solder.

The cutting of the wiring board 1 may be after the light emitting elements 6 is installed, or after the sealing resin is formed. In particular, when the wiring board 1 is manufactured by a roll-to-roll method, it is preferably to cut after all of the members provided on the wiring board 1 is formed and installed, because workability can be improved.

As the wiring pattern 3 formed exposed on the upper face 2c of the substrate 2 are covered by a layer of metal film (not shown) by electroplating, the strength of the wiring pattern 3 can be enhanced and degradation of the light emitting device S can be reduced.

Next, the narrow width parts 3d of the wiring pattern 3 and the bending lines L of the substrate 2 in the state shown in FIG. 3A are folded so as to superpose the upper face 2c by bending with a bending machine as shown in FIG. 2A, thereby forming the folded parts 2d. Here, the adhesive agent 4 is injected at the inner surface (between the upper face 2c and the folded parts 2d) to fix the folded parts 2d in their folded state.

As shown in FIGS. 7A and 7B, when the folded parts 2d are formed on the substrate 2, V-shaped narrow width parts 3d that are narrower than the width of the extensions 3c of the wiring pattern 3 are formed on the imaginary bending lines L. Therefore, the bending lines L on the substrate 2 can be locally weaker as the width of the extensions 3c is narrowed at the narrow width parts 3d, so the substrate 2 will be bent and folded while being guided by the narrow width parts 3d.

There are no particular limitations on the width of the narrow width parts 3d, but an example is about one-third to fourth-fifths of the width of the extensions 3c.

Accordingly, when the folded parts 2d are formed by folding the substrate 2 and the wiring pattern 3, the narrow width parts 3d serve as markers during folding, and if the area near the narrow width parts 3d is bent, the bent parts 2b will be automatically bent and formed with the bending lines L as the edge line.

As a result, the job of bending the bending lines L is simplified, and the folded parts 2d can be formed more easily and accurately.

Forming the folded parts 2d allows the positions of the ends 2a and the exposed parts 3a to be shifted by the creepage distance D from the ends in the width direction of the substrate 2 toward the center. The wiring board 1 is thus completed in the state shown in FIG. 1.

The wiring board 1 thus formed has an adequate creepage distance D secured, which prevents problems such as the risk that the drive power applied to the wiring pattern 3 will flow through the exposed parts 3a of the wiring pattern 3 to the metal housing and shock the user, and the infiltration of noise such as static electricity from the exposed parts 3a into the wiring pattern 3.

Next, the method for assembling the light emitting device S equipped with this wiring board 1 will be described.

As shown in FIG. 2A, first, the substrate 2 and the wiring pattern 3 are coated and covered with the resist 5 from the folded parts 2d on both sides of the wiring board 1 to the periphery of the mounting parts 3b.

As a result, the wiring board 1 is exposed from the resist 5 only at the mounting parts 3b and nearby, and other parts are covered by the resist 5 everywhere else. Next, the light emitting elements 6 are mounted on the mounting parts 3b.

Then, as shown in FIG. 6, the wiring board 1 is fixed to the housing Sc with double-sided tape (not shown) or another such fixing member, and is covered up by the cover member Sb, which completes the assembly of the light emitting device S.

The connector Sd at one end in the lengthwise direction of the housing Sc is then attached to the main body of a lighting fixture, the leads Se are connected to a power supply, and current flows, causing the light emitting elements 6 to emit light. The light emitted from the light emitting elements 6 is reflected by the resist 5 (reflecting member) and the wiring pattern 3 on the upper face 2c of the substrate 2, so it illuminates a wide area brightly.

Because the light emitting device S has a number of the light emitting elements 6 disposed in a row, it can be used as an LED lighting device having a shape that corresponds to a straight fluorescent tube.

The exposed parts 3a of the wiring board 1 thus assembled are disposed in the light emitting device S at positions that are shifted from the two edges in the width direction of the wiring board 1 toward the center, and are covered by the resist 5.

The configuration prevents static electricity and other such noise from infiltrating the wiring pattern 3 from the exposed parts 3a, which would cause uneven light emission from the light emitting elements 6, among other such problems. Also, the wiring board 1 reduces the risk of migration that may occur in the use of the light emitting device S.

The resist 5 is formed from a material that reflects the light emitted from the light emitting elements 6, and is disposed so as to cover the area around the light emitting elements 6. Accordingly, the resulting light emitting device S can have high light-extraction efficiency.

First Modification Example

The present invention is not limited to or by the above embodiment, and various modifications and changes are possible within the technological scope of the present invention. The present invention also encompasses these modifications and changes. In the description below, the same designations or the same reference numerals may, in principle, denote the same or like members.

As shown in FIG. 6, in the above embodiment, a case in which the surface of the folded parts 2d formed by folding is coated with the resist 5 is described as an example of the resist 5, but this is not limited thereto.

Figure 8:
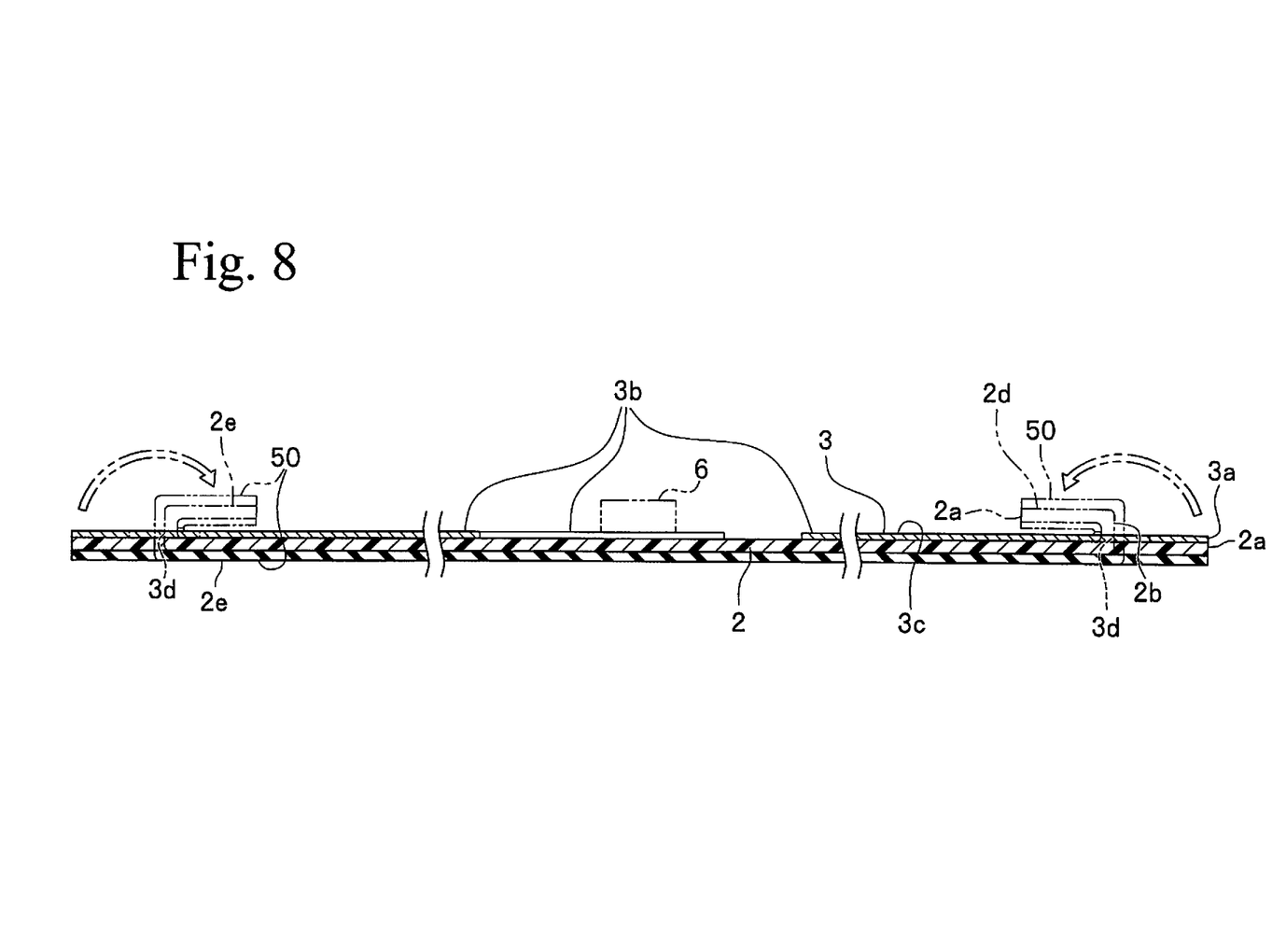
FIG. 8 shows another embodiment variation of the wiring board pertaining to an embodiment of the present invention.
Figure 9:
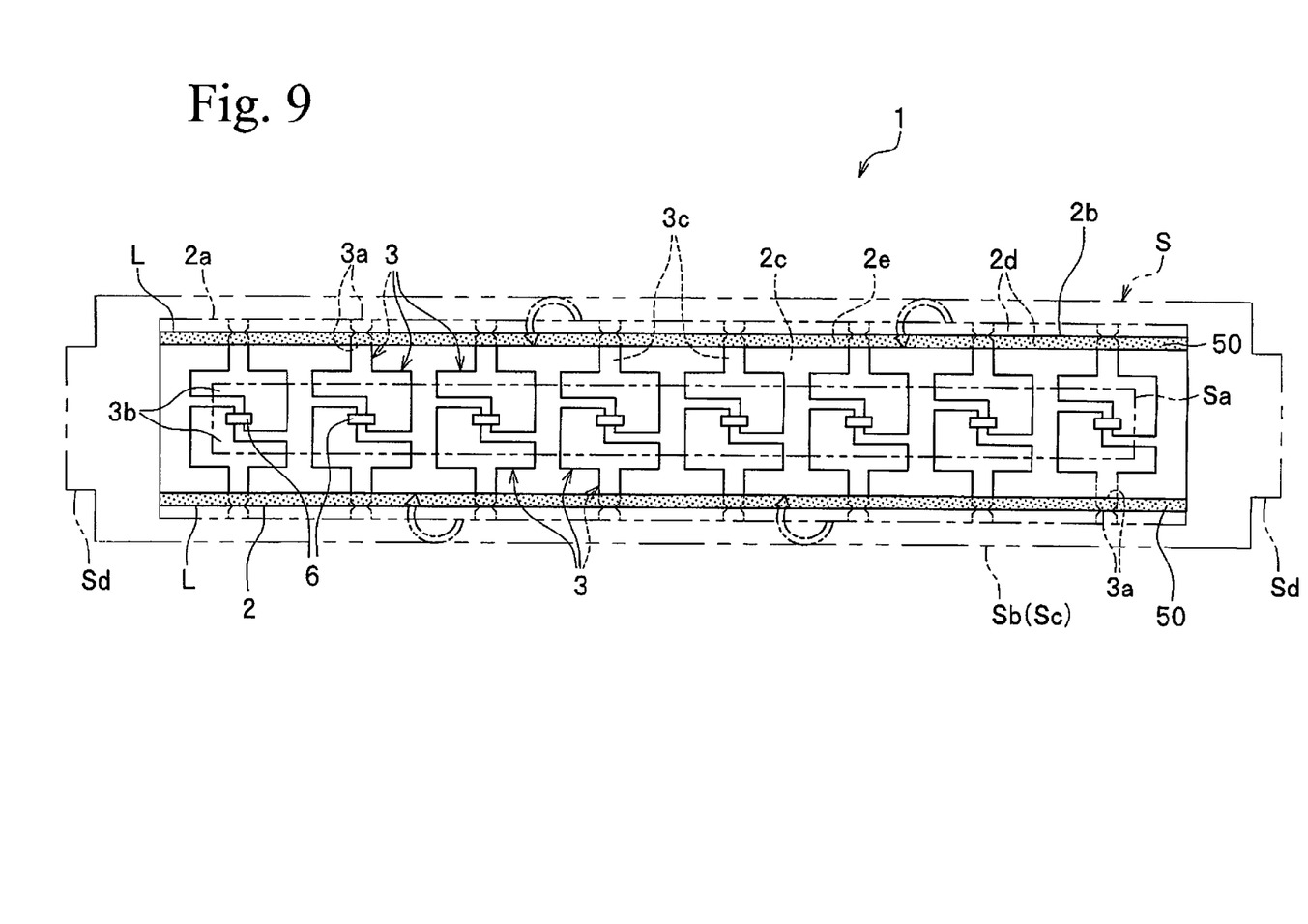
FIG. 9 shows another embodiment of the wiring board pertaining to an embodiment of the present invention and a light emitting device in which this wiring board is used.
Figure 10:
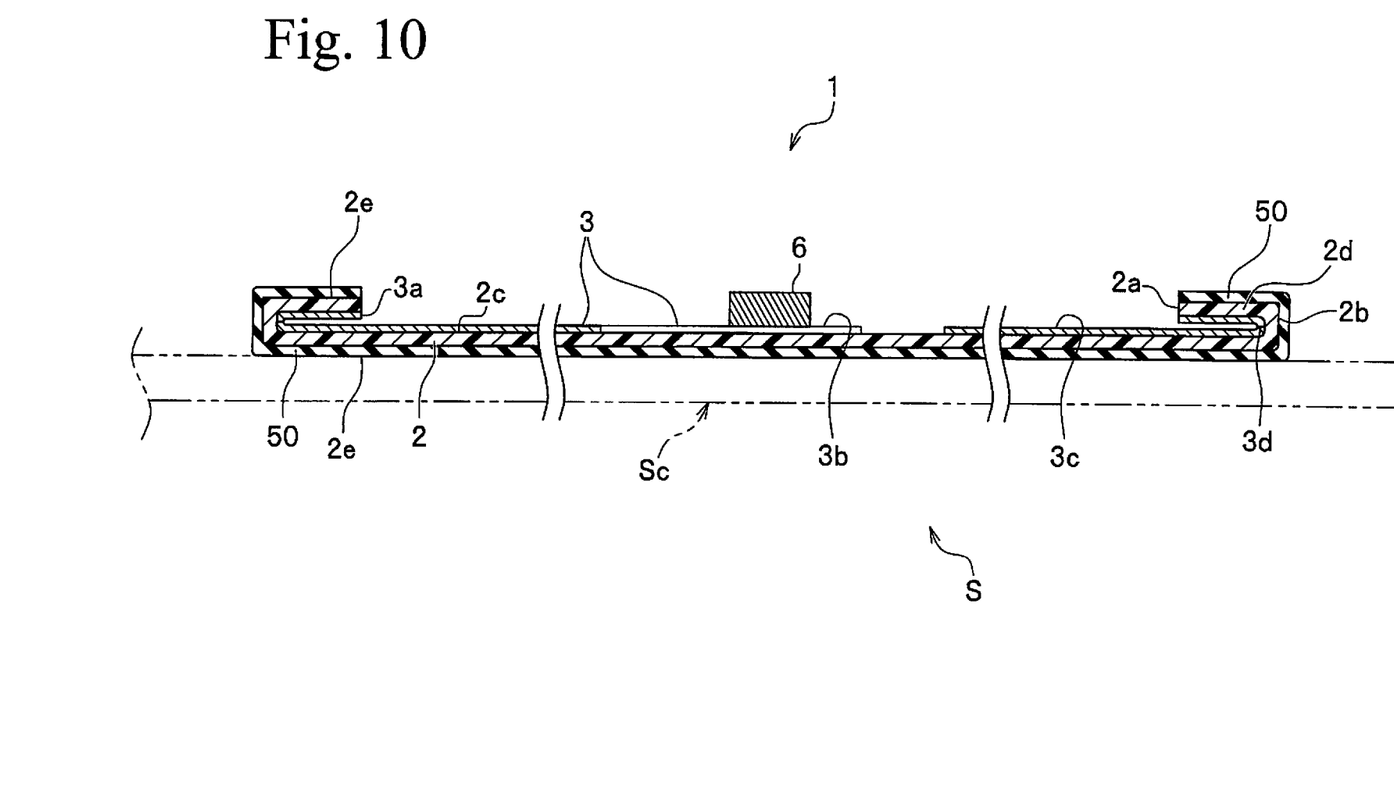
FIG. 10 shows another embodiment of the wiring board pertaining to an embodiment of the present invention, and a light emitting device in which this wiring board is used.

As shown in FIGS. 8 to 10, a resist 50 (reflecting member) may be provided to the entire rear face 2e of the substrate 2, and the resist 50 that is on the rear face 2e side of the substrate 2 before the folded parts 2d are formed may be disposed on the upper face 2c side of the substrate 2 when the bending lines L is bent toward the upper face 2c of the substrate 2 to form the folded parts 2d. This allows the resist 50 to be easily provided over the folded parts 2d.

As shown in FIG. 6, in the above embodiment an example is given in which the folded parts 2d are bonded with the adhesive agent 4 on the upper face 2c of the substrate 2, and the light emitting device S was fixed on the housing Sc with double-sided tape or the like, but as shown in FIGS. 9 and 10, the folded parts 2d of the substrate 2 may simply be folded, without using the adhesive agent 4 (see FIG. 7B) to bond the folded parts 2d on the upper face 2c side.

In this case, the folded parts 2d of the substrate 2 are formed by folding the two edges in the width direction of the substrate 2 toward the upper face 2c side, so that the bent parts 2b are engaged with substrate holding components of the housing Sc to hold the shape of the folded parts 2d, and the light emitting device S is fixed to the housing Sc. The structure may be such that the substrate holding components are provided to the housing Sc as in the above configuration, with examples of this structure including grooves, protrusions, and rails. Because the folded parts 2d of the substrate 2 are formed by folding the edges of the substrate 2, the strength of the edges of the substrate 2 is increased, and since the folded parts 2d and the substrate 2 itself are elastic, the folded parts 2d can be held securely elasticity of substrate 2 by the substrate holding components. As a result, the number of steps entailed by the assembly work and the drying time of the adhesive agent 4 can be reduced because there is no adhesive agent 4 or no double-sided tape or other such fixing member, so the work efficiency and mass productivity can both be improved.

Other Modification Examples

In the above embodiment, a light emitting device S that is used for a liquid crystal backlight, in which the wiring board 1 is bonded to the housing Sc in a state of being disposed flat is described. However, the light emitting device S can be given a shape corresponding to a straight fluorescent tube by housing the narrow and long, rectangular wiring board 1 in a translucent case or cover.

If the flexible wiring board 1 is bent in a circular shape in side view (with the upper face 2c on the outer peripheral side), and housed in a cover member Sb or housing Sc that is formed in an annular shape (doughnut shape), it is possible to obtain a lighting device with a shape corresponding to a round fluorescent tube.

Because the wiring board 1 can be bent, the light emitting device S can be changed to a device of a variety of shapes by bending the wiring board 1 in an arc shape, a V shape, a U shape, a semicircular shape, or the like, and housing it in a cover member Sb or housing Sc having a shape adapted to the wiring board 1.

In the above embodiment, the light emitting device S is described by giving an example in which the light emitting elements 6 are disposed in a row in the lengthwise direction of the rectangular wiring board 1. However, the light emitting device S may, for example, be such a configuration that a plurality of light emitting elements 6 disposed in a row in the lengthwise direction of the rectangular wiring board 1 make up one set, and a plurality of sets of light emitting elements 6 are disposed in a plurality of rows in the lengthwise direction.

Electronic elements other than the light emitting elements 6 may be provided to the light emitting part Sa of the light emitting device S. Examples of electronic elements other than the light emitting elements 6 include a Zener diode that absorbs surges and the like in the light emitting device S and protects the electrical circuits, as well as a transistor, an IC, and other such semiconductors. These may be connected to the light emitting elements 6 via the wiring pattern 3. Electronic elements other than the light emitting elements 6 may be suitably provided as needed.

The housing Sc disposed on the rear face 2e side of the substrate 2 can function as a heat sink in the case where it is formed from a material with excellent thermal conductivity for dissipating heat emitted from the light emitting elements

6. In this case, there are no particular restrictions on the material of the heat sink as long as it has good thermal conductivity, but it may be a ceramic or other such insulating material, or copper, galvanized steel, aluminum, magnesium, or another such metal.

The narrow width parts 3d are not limited to being V-shaped cutouts, and may be modified as desired, so long as they allow the bent parts 2b located at a specific distance from the ends 2a in the width direction of the substrate 2 to be easily and accurately bent along the bending lines L. For instance, the narrow width parts 3d may be such that both edges of the extensions 3c are formed in a concave shape, or are in a stepped shape, or holes are continuously formed like a dotted line in the extensions 3c and the substrate 2, or slits are formed.

A case in which the wiring pattern 3 are provided only to the upper face side of the substrate 2 is described, but the wiring pattern 3 may also be provided to the rear face 2e, and pier holes that communicate with the upper face side and the rear face 2e side may be formed, with conductive members inserted into this pier holes to link the front and back.

This allows many of the light emitting elements 6 to be easily wired and electrically connected.

In the above embodiment, the resist 5 disposed so as to cover in stepwise fashion the folded parts 2d that are disposed in stepwise fashion over the substrate 2 is described as an example of the resist 5, but the resist 5 (reflecting member) may be formed so as to constitute a reflecting face in a state of being inclined to the light emitting elements 6, so that light emitted from the light emitting elements 6 disposed in the center part of the substrate 2 will be reflected forward on the upper face 2c side of the substrate 2.

Forming the resist 5 in this way allows the light emitting device S to have even more light efficiency.

The folded parts 2d may be formed not only by folding one time, but also by folding two or more times. Also, the folded parts 2d may be bent so as to wrap the exposed parts 3a with the substrate 2. This prevents static electricity and other such noise from infiltrating from the exposed parts 3a.

The folded parts 2d do not need to be provided on the whole end of the substrate 2 along the lengthwise direction, and can instead be provided only to the portion with the exposed parts 3a. Also, the folded parts 2d do not need to be uniform in width, and just the portion with the exposed parts 3a can be made wider than the portion without them. The plurality of light emitting elements 6 may be not only in series connection, but also in parallel connection, in series-parallel connection, and in parallel-series connection.

What is claimed is:

1. A wiring board comprising:
   an insulated substrate having an elongated shape with shorter sides extending along a width direction;
   a wiring pattern provided on the insulated substrate, the wiring pattern extending between both ends in the width direction of the insulated substrate, and having an exposed part exposed at at least one of the ends of the insulated substrate, at least a part of an end surface of the wiring pattern that extends along a lengthwise direction of the insulated substrate coinciding with an end surface of the insulated substrate; and
   a folded part in which the exposed part of the wiring pattern and the insulated substrate are integrally folded up inwardly toward an upper face side of the insulated substrate at each of the ends of the insulated substrate; wherein an upper face of the folded part has insulating properties, and a light emitting element disposed on the wiring board.

2. The wiring board according to claim 1, wherein the folded part and the upper face side of the insulated substrate are bonded together with an adhesive agent.

3. The wiring board according to claim 1, wherein the folded part is covered with a reflective member.

4. The wiring board according to claim 1, wherein the wiring pattern has a plurality of extension portions each having the exposed part with the extension portions being arranged along the lengthwise direction of the insulated substrate, and a mounting part continuously extending from the extension portions and on which a light emitting element is mounted.

5. The wiring board according to claim 4, wherein each of the extension portions has a narrow width part, and the folded part is formed by folding the insulated substrate and each of the extension portions along a bending line where the narrow width part is provided.

6. The wiring board according to claim 1, wherein each of edges in the width direction of the wiring board is made up of a total of five layers including
   a layer composed of the insulated substrate that is folded,
   a layer composed of an extension portion of the wiring pattern that is folded,
   a layer composed of an adhesive agent,
   a layer composed of the extension portion of the wiring pattern that is not folded, and
   a layer composed of the insulated substrate that is not folded.

7. The wiring board according to claim 1, wherein each of edges in the width direction of the wiring board is made up of a total of six layers including
   a reflective member,
   a layer composed of the insulated substrate that is folded,
   a layer composed of extension of the wiring pattern that is folded,
   a layer composed of an adhesive agent,
   a layer composed of the extension of the wiring pattern that is not folded, and
   a layer composed of the insulated substrate that is not folded.

8. The wiring board according to claim 1, wherein the at least the part of the end surface of the wiring pattern includes at least two portions of the end surface of the wiring pattern that coincide with the end surface of the insulated substrate.

9. The wiring board according to claim 1, wherein two portions of the wiring pattern face each other via insulating material at the folded part.

10. The wiring board according to claim 1, wherein the folded part is arranged at both ends in the width direction of the insulated substrate so that a thickness at both ends in the width direction of the wiring board is larger than a thickness in a center region of the wiring board.

11. The wiring board according to claim 1, wherein the exposed part is arranged at a position closer to the center of the insulated substrate from the at least one of the ends in the width direction of the substrate.

12. The wiring board according to claim 2, wherein the adhesive agent is a white material with high reflectivity.

13. The wiring board according to claim 1, wherein the wiring pattern has a thickness of about 10 to 200 μm.

14. The wiring board according to claim 5, wherein a width of the narrow width part is about one-third to fourth-fifths of a width of each of the extension portions.

* * * * *